United States Patent
Ahsan et al.

(10) Patent No.: US 9,087,719 B2
(45) Date of Patent: Jul. 21, 2015

(54) EXTENDED DRAIN NON-PLANAR MOSFETS FOR ELECTROSTATIC DISCHARGE (ESD) PROTECTION

(71) Applicants: Akm Ahsan, Beaverton, OR (US); Walid M. Hafez, Portland, OR (US)

(72) Inventors: Akm Ahsan, Beaverton, OR (US); Walid M. Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 305 days.

(21) Appl. No.: 13/631,586

(22) Filed: Sep. 28, 2012

(65) Prior Publication Data

US 2014/0092506 A1    Apr. 3, 2014

(51) Int. Cl.
| | |
|---|---|
| H02H 9/00 | (2006.01) |
| H01L 27/088 | (2006.01) |
| H01L 27/02 | (2006.01) |
| H02H 9/04 | (2006.01) |
| H01L 27/12 | (2006.01) |
| H02H 1/04 | (2006.01) |
| H02H 3/22 | (2006.01) |

(52) U.S. Cl.
CPC .......... *H01L 27/0886* (2013.01); *H01L 27/027* (2013.01); *H01L 27/1211* (2013.01); *H02H 9/046* (2013.01); *H01L 2924/0002* (2013.01)

(58) Field of Classification Search
USPC .......................................................... 361/56
See application file for complete search history.

(56) References Cited

U.S. PATENT DOCUMENTS

| 8,779,517 B2 * | 7/2014 | Lin et al. ........................ 257/355 |
| 2006/0273372 A1 | 12/2006 | Voldman et al. |
| 2009/0001607 A1 * | 1/2009 | Schnitt et al. ................. 257/779 |

FOREIGN PATENT DOCUMENTS

| JP | 2007-053316 A | 3/2007 |
| JP | 2011-014753 A | 1/2011 |
| KR | 10-2010-0037814 A | 4/2010 |
| KR | 10-2011-0077889 A | 7/2011 |

OTHER PUBLICATIONS

"Optimization of LGate for ggNMOS ESD Protection Devices Fabricated on Bulk- and SOI-Substrates, Using Process and Device Simulation," by Deckelmann and Wachutka, Munich University of Technology, from IEEE 2003, 4 pages.
International Search Report and Written Opinion mailed Oct. 22, 2013 for PCT/US2013/046657 filed Jun. 19, 2013.
International Preliminary Report and Written Opinion for PCT/US2013/046657, International Filing Date Jun. 19, 2013, mailing date Apr. 9, 2015, 8 pages.

\* cited by examiner

*Primary Examiner* — Dharti Patel
(74) *Attorney, Agent, or Firm* — Blakely, Sokoloff, Taylor & Zafman LLP

(57) ABSTRACT

Snapback ESD protection device employing one or more non-planar metal-oxide-semiconductor transistors (MOSFETs) are described. The ESD protection devices may further include lightly-doped extended drain regions, the resistances of which may be capacitively controlled through control gates independent of a gate electrode held at a ground potential. Control gates may be floated or biased to modulate ESD protection device performance. In embodiments, a plurality of core circuits are protected with a plurality of non-planar MOSFET-based ESD protection devices with control gate potentials varying across the plurality.

25 Claims, 8 Drawing Sheets

US 9,087,719 B2

EXTENDED DRAIN NON-PLANAR MOSFETS FOR ELECTROSTATIC DISCHARGE (ESD) PROTECTION

TECHNICAL FIELD

Embodiments of the invention generally relate to electrostatic discharge (ESD) protection of integrated circuits (ICs), and more particularly relate to ESD protection devices employing non-planar metal-oxide-semiconductor field effect transistors (MOSFETs).

BACKGROUND

ESD is a threat to IC reliability. Introduction of new materials in IC fabrication and the scaling of critical transistor interconnect dimensions and dielectrics have increased a circuit's susceptibility to ESD events and degraded the capability to safely dissipate ESD charge. This technological trend poses even greater challenges for design of effective protection structures and circuit topologies. The need to reduce parasitic capacitance on high speed input/output lines of an IC chip (i.e., I/Os), as well as the need to reduce chip area consumed by ESD protection circuits pose further challenges. Leakage currents associated with conventional ESD protection devices during normal operation (i.e., when there is no ESD event) is another significant problem for sub 32 nm technology nodes.

ESD protection devices in the art may be divided into two general categories: snapback devices and non-snapback devices. The most typical non-snapback devices are p-n junction diodes usually arranged in a dual diode configuration where two diodes (P+/n and N+/p) are connected back to back and the pair further connected to an exposed I/O pin or pad. During an ESD event the diodes sink current so as to protect the I/O device and internal circuitry of the IC chip from damage, such as gate oxide breakdown, source-drain shorts, interlayer dielectric (ILD) breakdown, etc. The most typical snapback devices are transistor based, primarily MOSFETs. While snapback devices usually have relatively smaller size and lower parasitic capacitance than non-snapback implementations, "off-state" source-drain leakage current is a bigger problem for MOSFET-based designs, particularly at the 22 nm CMOS technology node. An ESD protection snapback device which can conduct higher current (during ESD event) and provide lower leakage current (during normal operation) is therefore needed for 22 nm CMOS technology node and beyond.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Figure 1A:
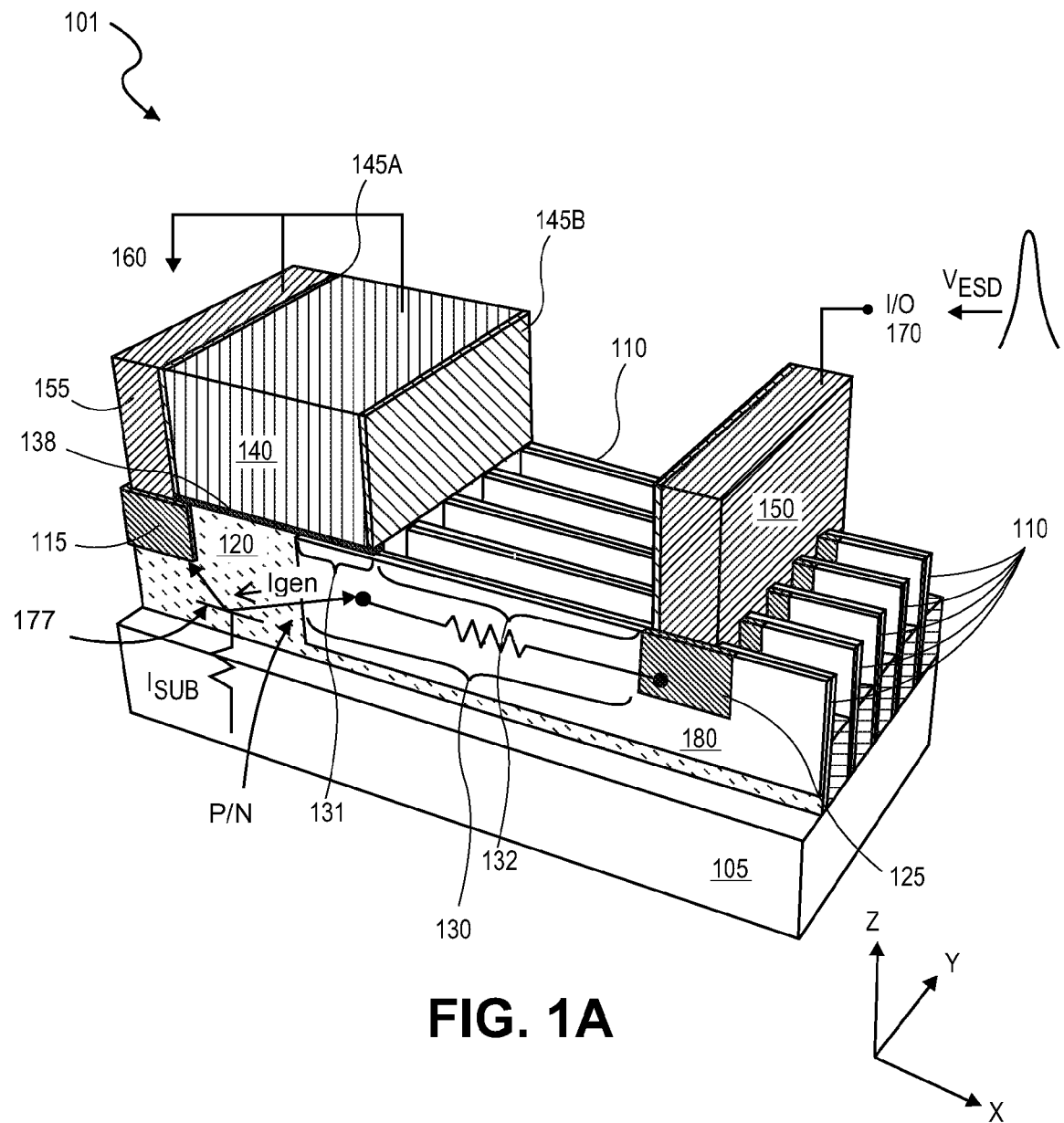
FIG. 1A is a sectioned isometric view of an extended drain non-planar MOSFET for electrostatic discharge (ESD) protection, in accordance with an embodiment of the present invention.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

In embodiments, a snapback ESD protection device employs one or more non-planar metal-oxide-semiconductor transistors (MOSFETs). Generally, the non-planar transistor structure, also known as a finFET, offers significantly lower leakage current (e.g., by ~50%) relative a two dimensional, or planar FET, during normal operation (i.e., when there is no ESD event occurring). The reduced leakage is, at least in part, because of greater gate control of the channel region (e.g., channel is surrounded on two, three, or even four sides for a gate all around or nanowire design) which more effectively suppresses sub-threshold or "off-state" leakage current. This reduced leakage ultimately reduces power consumption of snapback ESD protection devices. Furthermore, the non-planar transistor structure enhances drive current when the ESD protection device is in the "on" state (i.e., during an ESD event). As such, relative to a planar snapback ESD protection device, the higher ESD current conductance offers more robust ESD protection for a given area of the chip.

FIG. 1A is a sectioned isometric view of a non-planar MOSFET electrostatic discharge (ESD) protection device 101, in accordance with an embodiment of the present invention. As illustrated, the ESD protection device 101 includes a plurality of non-planar semiconductor bodies, or fins 110 extending from a surface of a substrate 105. A plurality of semiconductor fins 110 is advantageous for the protection device 101 to provide robust ESD protection (i.e., high current conduction capability). The number of semiconductor fins 110 coupled to the gate electrode 140 may vary widely depending on application and on the drive current achievable for a single fin, which is further dependent on z-height of the fins, etc. As such, while a plurality of semiconductor fins 110 is depicted as being an advantageous embodiment, single semiconductor fin embodiments are also envisioned. Although geometries are transient being a function of the technology node, for the exemplary 22 nm node, fins 110 may be expected to be 5-20 nm in width (y-dimension) and 20-60 nm in z-height. Generally, the fins 110 and substrate 105 may be a same or different material (e.g., where fins are a heteroepitaxial layer) and while the fins 110 are illustrated in the exemplary embodiment as part of the bulk semiconductor of the substrate 105, in alternate embodiments, an insulator layer may separate the fins 110 from the substrate 105 (e.g., as in an SOI substrate). In the exemplary embodiment, the fins 110 include silicon, and more particularly are single-crystalline silicon with other constituents limited to electronically active dopant species. In other embodiments, the fins 110 comprise a compound semiconductor alloy, such as but not limited to SiGe, III-N materials (e.g., GaN), or III-V materials (e.g., InP, InSb, InAs, etc.). Similarly, while the substrate 105 is also single-crystalline silicon, in other embodiments, the substrate 105 may be any of the semiconductors listed for the fins 110, and may further be an insulator such as sapphire or SiC, etc.

As illustrated in FIG. 1A, the ESD protection device 110 further includes a gate electrode 140 disposed over the plurality of semiconductor fins 110. The single gate electrode 140 extends over the plurality of semiconductor fins 110 to capacitively control a channel region 120 in each of the semiconductor fins 110 in parallel. A source region 115 and a drain region 125 are disposed in each of the semiconductor fins 110 on opposite sides of the gate electrode 140. The source region 115 and drain region 125 are both heavily doped regions of the fins 110 and in the exemplary embodiment where the channel region 120 is p-type, the source region 115 and drain region 125 are both doped n-type to form a non-planar NMOS structure. The source regions 115 are coupled in electrical parallel to source contact metallization 155 while the drain regions 125 are coupled in electrical parallel to the drain contact metallization 150. As shown, both the source contact metallization 155 and the gate electrode 140 electrically coupled to one or more integrated circuit (IC) nodes 160 having a same reference potential, typically ground common to a core circuitry that the protection device 101 is to protect. The drain contact metallization 150 electrically couples the drain region 125 to a circuit node 170 disposed between an I/O (e.g., a pad or pin) of an IC and the core circuitry which the protection device 101 is to protect.

Figure 2A:
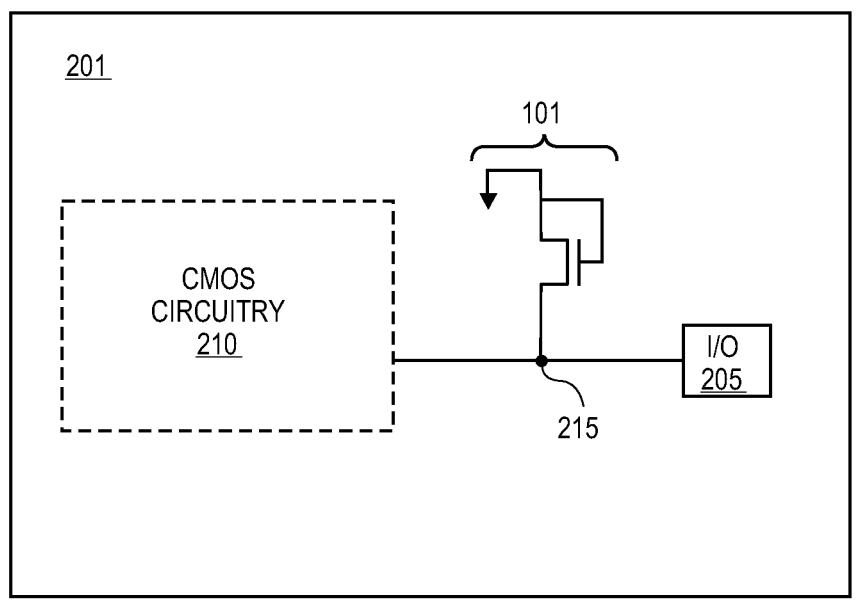
FIG. 2A is a schematic of an extended drain non-planar MOSFET configured for ESD protection of CMOS circuitry coupled to an I/O pad, in accordance with an embodiment.

FIG. 2A is a schematic of a non-planar MOSFET configured for ESD protection of CMOS circuitry coupled to an I/O pad, in accordance with an embodiment. As shown, an IC chip 201 includes core CMOS circuitry 210, such as but not limited to, microprocessor logic gates, memory cells, etc. The CMOS circuitry 210 is electrically connected to an I/O 205, through which the CMOS circuitry 210 interfaces with devices external to the IC chip 201. The I/O 205 may be any conventional I/O pad, pin, post, wire, etc. The ESD protection device 101 (illustrated in FIG. 1A) is electrically connected to the circuit node 215 disposed between the CMOS circuitry 210 and the I/O 205. In the exemplary embodiment illustrated in FIGS. 1A and 2A, a non-planar MOSFET is in a grounded-gate NMOS (ggNMOS) configuration. In this configuration, in normal operating mode, the ESD protection device 101 remains in an "off-state" with the channel region 120 conducting very little leakage current because of the grounded gate electrode 140 being present on three sides of the fins 110. Referring further to FIG. 1A, during an ESD event at the node 170 coupled to an I/O of core circuitry, the voltage ($V_{EST}$) at the drain region 125 increases, reversing the p-n junction between the drain region 125 and substrate until avalanche breakdown occurs. At this point, drain current increases, and holes generated ($I_{gen}$) drift towards a substrate contact ($I_{sub}$), increasing the base voltage of the parasitic bipolar junction transistor (BJT) 177, which makes the base-emitter junction of the parasitic BJT 177 more forward biased. As the base-emitter voltage increases, the parasitic BJT 177 turns on. The drain voltage at turn-on of the BJT 177 is referred to as the trigger voltage ($V_t$) of the protection device 101. With the BJT 177 on, more current is generated and drain voltage required for a given drain current falls in the negative differential resistance, or "snap-back," regime of the protection device until the drain voltage is reduced to the holding voltage $V_h$. The current conducted at $V_h$ and there beyond sinks ESD event current and protects the core circuit coupled to the I/O node 170. This snapback ESD protection behavior is further illustrated in FIG. 3 as discussed elsewhere herein.

In embodiments, a non-planar MOSFET-based ESD protection device includes a lightly doped extended drain region. A lightly doped extended drain region advantageously offers further reduced off-state leakage levels during normal operation and the ability to modulate snapback characteristics of the protection device 101, either on a global IC chip-level or an I/O-core circuit dependent level. A lightly doped extended drain region also advantageously permits critical dimensioning of the gate electrode 140 independent of voltage levels to be supported by the ESD protection device. For example, even where a high voltage is to be supported by an ESD protection device a critical dimension of the gate electrode 140 may be the same as that employed in core circuits configured to operate at significantly lower voltages. Depending on the geometry of the lightly doped extended drain region (e.g., x-dimension spacing vs. z-height, etc.), the relative impact on the off-state leakage vs. on-state action of the parasitic BJT 180 may vary. For example, lightly doped drain region may pose a series resistance during the off-state that is more significant than during the on-state. Referring still to FIG. 1A, a lightly doped extended drain region 180 is disposed in each of the semiconductor fins 110 and spaces the gate electrode 140 apart from the drain region 125 by an amount greater than a spacing between the gate electrode 140 and the source region 115. In other words, the fin distance 132 along the x-axis is longer than, or "extended" relative to, a corresponding distance between gate electrode 140 and the source region 115 (which is generally controlled by a thickness of dielectric spacer 145A disposed on the gate electrode 140).

As is shown in FIG. 1A, the lightly doped extended drain region 180 extends through a z-height of the fins 110 that is greater than that occupied by the drain region 125. Furthermore, the lightly doped extended drain region 180 extends along the x-dimension of the fins 110 and is present on side of the drain region 125 opposite the gate electrode 140. In other words, the drain region 125 is embedded within the lightly doped extended drain region 180. Generally, for the exemplary ggNMOS embodiment, the lightly doped extended drain region 180 comprises an n-well disposed between the p-type channel region 120 and the n-type drain region 125. In certain such exemplary embodiments, the lightly doped extended drain region 180 is doped n-type to $10^{16}$ cm$^{-3}$-$10^{20}$ cm$^{-3}$ In further embodiments, the lightly doped extended drain region 180 is disposed a distance 131 under the gate electrode 140 with the distances 131 and 132 making up a total lightly doped extended drain length 130 between the channel region 120 and the drain region 125. Generally, along with a critical dimension of the gate electrode 140 (e.g., 22 nm, etc.), the distance 131 can be controlled through a well implant to set a desired base width of the parasitic BJT 180, which impacts $V_h$ of the protection device 101, and as shown may be significantly greater than a corresponding overlap between the source region 115, or between an associated source region 115 lightly-doped tip (if present).

Figure 1B:
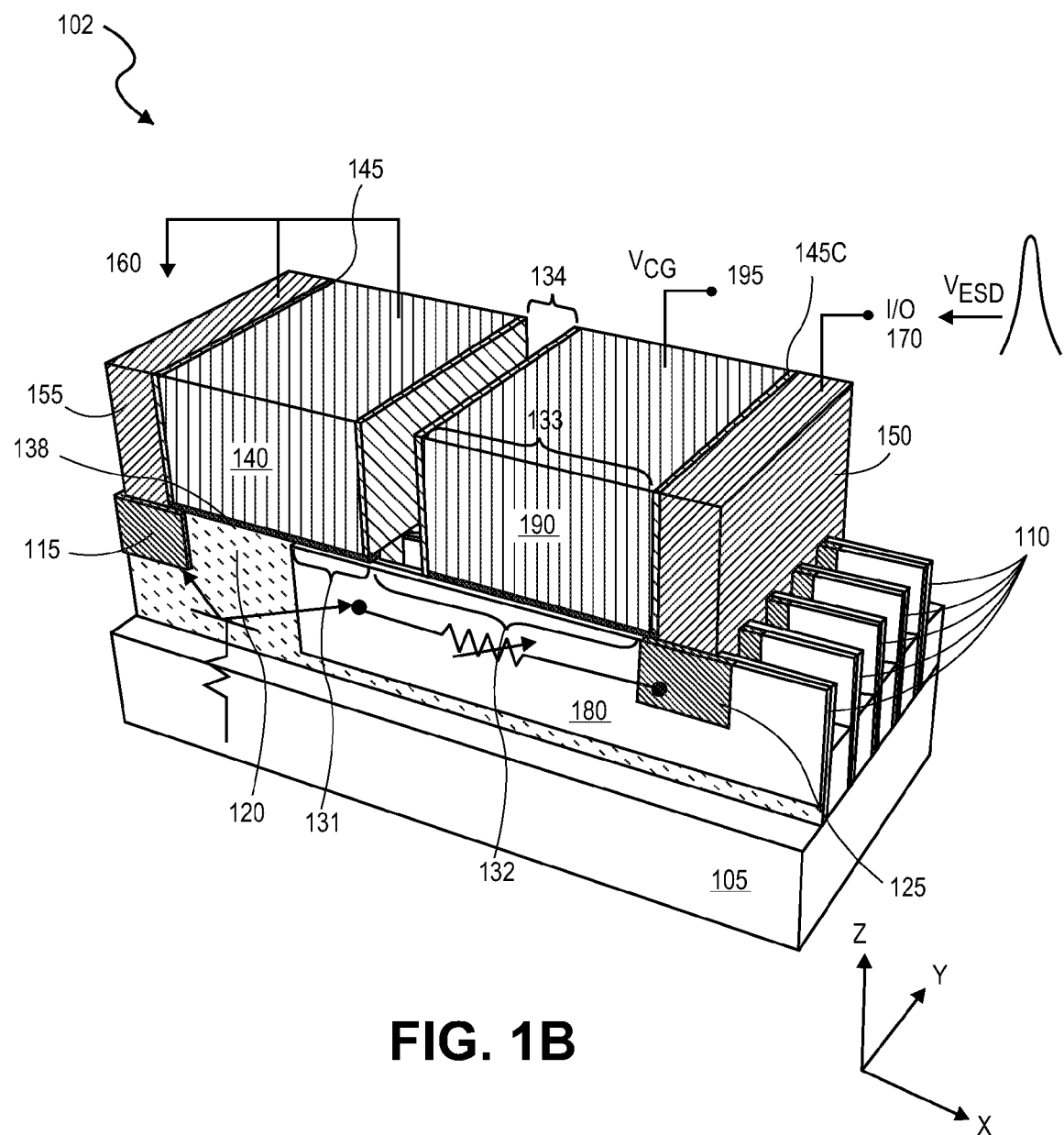
FIG. 1B is a sectioned isometric view of an extended drain non-planar MOSFET with a control gate for ESD protection, in accordance with an embodiment of the present invention.

In embodiments, an extended drain non-planar MOSFET-based ESD protection device includes a control gate. FIG. 1B is a sectioned isometric view of an extended drain non-planar MOSFET 102 with a control gate 190 for ESD protection, in accordance with an embodiment of the present invention. Structures and features common between the ESD protection device 101 and ESD protection device 102 share the same reference numbers and any characteristics described for a particular structure in the context of FIG. 1A is applicable to a like structure depicted in FIG. 1B.

Generally, the control gate 190 is capacitively coupled to at least a portion of the lightly doped extended drain region 180 and electrically insulated from the gate electrode 140 so that the control gate 190 is electrically independent from the gate electrode 140 to the extent that the control gate 190 may be at a different electrical potential than the gate electrode 140. In the exemplary embodiment, both the gate electrode 140 and the control gate 190 are capacitively coupled to the semiconductor fins 110 through a same dielectric 138. The dielectric 138 may be any "gate" dielectric known in the art, with the exemplary embodiment employing a high-k dielectric material (e.g., having a bulk dielectric constant that is higher than that of silicon nitride). Exemplary embodiments of the dielectric 138 include, but are not limited to hafnium oxide, zirconium oxide, and alloys thereof (including silicates). While the control gate 190 may be of any material, in the exemplary embodiment the control gate 190 is of the same material(s) as that of the gate electrode. For example, in one ggNMOS embodiment, both the gate electrode 140 and control gate 190 include a same high work function metal.

As illustrated in FIG. 1B, the control gate 190 is electrically isolated from both the gate electrode 140 and the drain contact metallization 150. In the illustrative embodiment, the control gate 190 is disposed more proximate to the drain contact metallization 150 than it is to the gate electrode 140. In other words, the control gate 190 is spaced apart from the gate electrode 140 by a distance 134, along the x-dimension of the fins 110, which is greater than a distance between the control gate 190 and the drain contact metallization 150. In one such embodiment, the lateral spacing between the control gate 190 and the drain region 125 is the same as the spacing between the gate electrode 140 and the source region 115 with the thickness of the dielectric spacer 145A between the gate electrode 140 and source contact metallization 155 being be approximately the same as the thickness of the dielectric spacer 145C between the control gate 190 and the drain contact metallization 150. In further embodiments, the distance 134 is approximately equal to the x-dimension (length) of the source and drain contact metallizations 155, 150, respectively. For the illustrated embodiment, the protection device 102 incorporates the control gate 190 in a manner that provides a physically symmetrical architecture which may be advantageously fabricated with no additional masking operations beyond those used to fabricate the ESD protection device 101 illustrated in FIG. 1A.

Generally, for ESD protection device embodiments with a control gate, snapback characteristics may be further modulated through an electrical potential applied to the control gate. For embodiments represented by FIG. 1B, therefore, the control gate 190 is to control charge carrier depletion or accumulation within the lightly doped extended drain region 180 to adjust a snapback characteristic (e.g., holding voltage $V_h$, current at on-state, etc.) of the device 102. In embodiments, the control gate 190 is coupled to a control gate voltage source 195 which provide as control gate voltage $V_{cg}$. Generally, the control gate voltage source 195 may set the control gate 190 to any control gate voltage independent of the gate electrode 140. In certain embodiments, the control gate voltage source 195 floats the control gate 190, to provide a predetermined default extended drain resistivity or resistance for the ESD protection device 102. In another embodiment, the control gate voltage source 195 sets the control gate 190 to a predetermined control gate voltage potential that is neither floating nor the reference potential of the gate electrode 140 (e.g., common ground of a protected core circuit). Depending on the applied control gate bias voltage, carrier depletion of the extended drain may be induced to increase the effective channel resistance or carrier accumulation of the extended drain may be induced to reduce the effective channel resistance. For example, the control gate voltage source 195 may set the control gate 190 to a predetermined voltage potential between approximately 0.5 and 1.2V for an exemplary ggNMOS device having an extended drain with n-type doping level in the range described elsewhere herein.

Figure 2B:
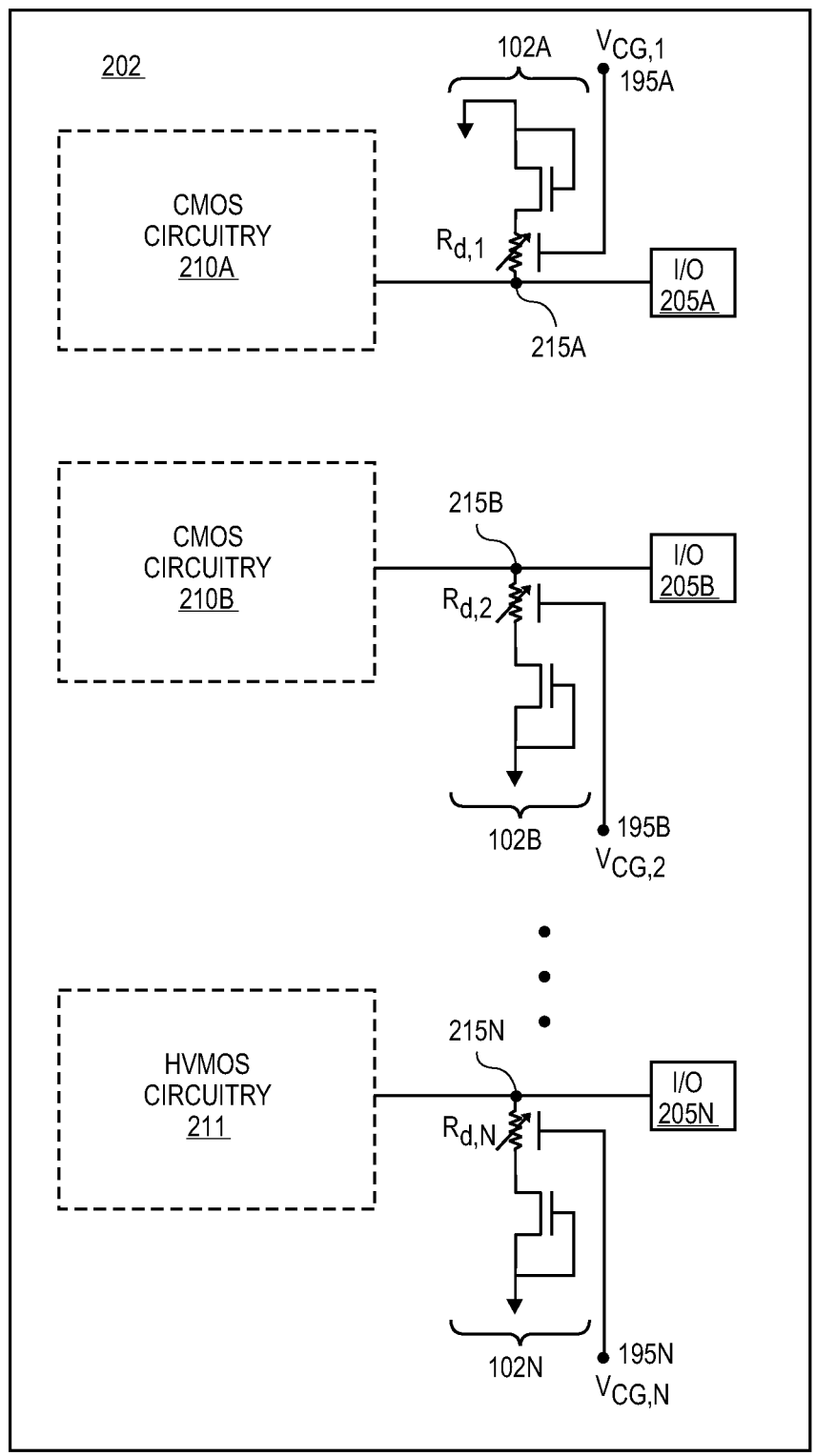
FIG. 2B is a schematic of a plurality of extended drain non-planar MOSFETs configured for ESD protection of a plurality of CMOS circuitry, in accordance with embodiments.

In embodiments, a plurality of extended drain non-planar MOSFETs are configured for ESD protection of a plurality of core circuits. FIG. 2B is a schematic of a plurality of extended drain non-planar MOSFET-based ESD protection devices 102A, 102B and 102N configured for ESD protection of a plurality of CMOS circuitry, in accordance with embodiments. As illustrated, the IC chip 202 includes a first core CMOS circuit 210A connected to a first I/O 205A, with the first ESD protection device 102A connected at a node 215A disposed there between. Disposed over a second area of the IC chip 202 is a second CMOS circuitry 210B connected to a second I/O 205B, with the second ESD protection device 102B connected at a node 215B disposed there between. Disposed over a third area of the IC chip 202 is a high voltage MOSFET-based circuitry (HVMOS) 211 connected to an I/O 205N, with the ESD protection device 102N connected at a node 215N disposed there between. Notably, while the ESD protection devices 102A-102N have extended drains, the core circuits may utilize non-planar MOSFETs which lack any such extended drain. As one example, wherein the CMOS circuit 210A is low voltage circuit and comprises one or more non-planar MOSFETs, no extended drain is provided, the absence of which results in a nominal transistor source-drain resistance $R_{sd}$. In further embodiments, at least one of the non-planar MOSFETs in the high voltage circuit HVCMOS 211 includes an extended drain region imparting a relatively higher $R_{sd}$ than found in any of the non-planar MOSFETs found in the low voltage CMOS circuit 210A. As such, the non-planar extended drain MOSFET-based ESD protection device architectures described herein are compatible with a range of core circuit architectures.

Figure 2C:
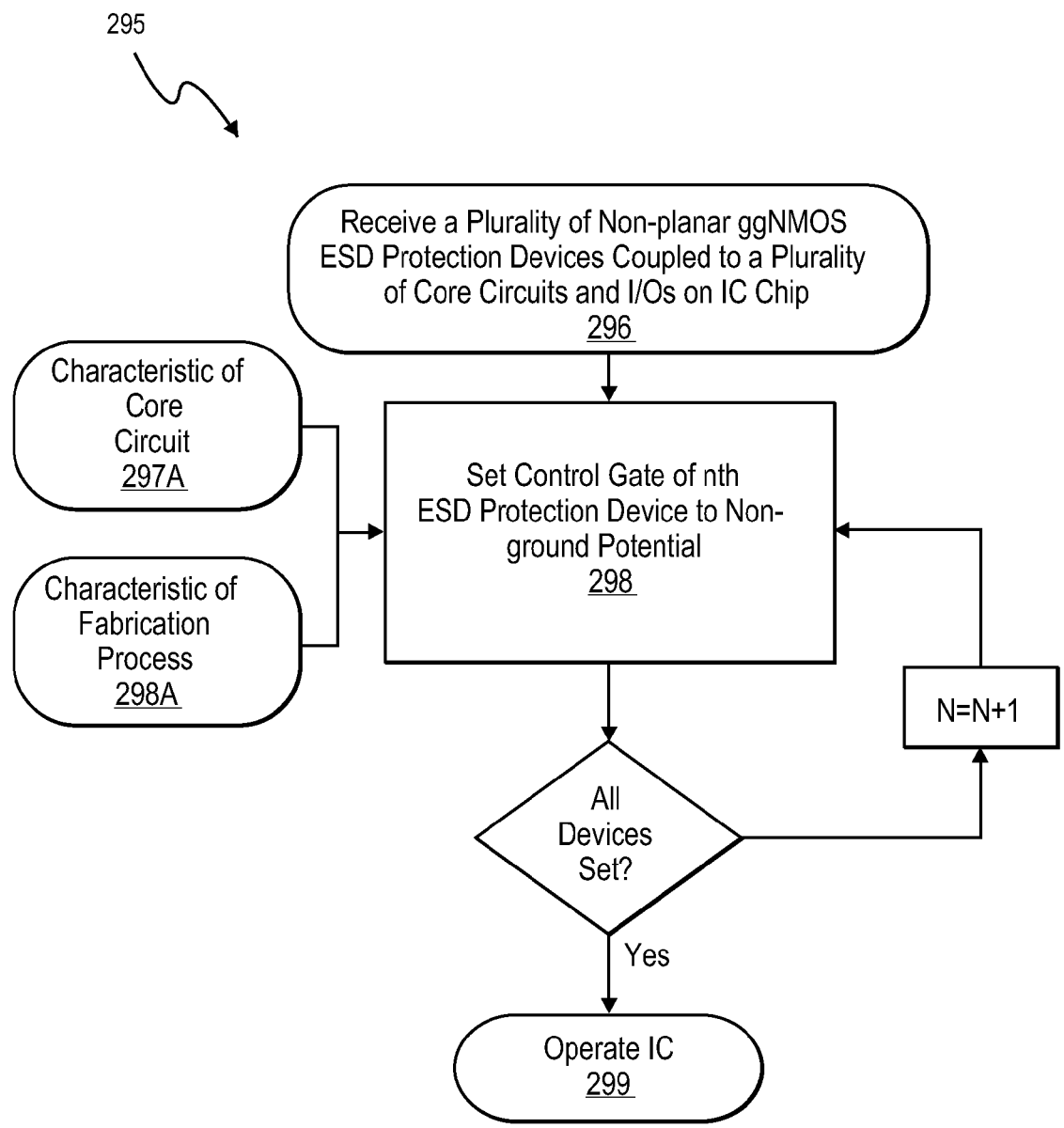
FIG. 2C is a flow diagram illustrating operation of a plurality of extended drain non-planar MOSFETs configured for ESD protection of a plurality of CMOS circuitry, in accordance with embodiments.

In the illustrative embodiment, each of the ESD protection devices 102A, 102B and 102N include a non-planar ggNMOSFET with an extended drain and a control gate, substantially as is illustrated in FIG. 1B. As further illustrated in FIG. 2B, a plurality of control gate voltage sources 195A, 195B, and 195N are separately coupled to the ESD protection devices 102A, 102B, and 102N, respectively. While each of the ggNMOSFETs are have gate electrodes and source regions held at a reference potential (e.g., ground), the control gate voltage sources 195A, 195B, and 195N are independently controllable to predetermined voltage potentials $V_{cg,1}$, $V_{cg,2}$, and $V_{cg,n}$, respectively, that are other than the reference (ground) potential. FIG. 2C is a flow diagram illustrating operation of a plurality of the extended drain non-planar MOSFETs configured for ESD protection, in accordance with further embodiments. The method 295 begins at operation 296 with the IC chip 202 illustrated in FIG. 2B. At operation 298, predetermined control gate bias voltages are applied, for example through control gate voltage sources 195A, 195B, and 195N. In embodiments, predetermined control gate voltage potentials $V_{cg,1}$, $V_{cg,2}$, and $V_{cg,n}$ are selected to adjust a snapback voltage of each ESD protection device based on a characteristic of the core circuit to which the ESD protection device is coupled (e.g., received at operation 297A). As such, the robustness of the ESD protection and/or power consumption associated with a particular ESD device may be tailored based on the core circuit requirements. One exemplary characteristic is a nominal operating voltage of a core circuit. For example, a core circuit operating at higher operating voltages may be coupled to an ESD device configured with a control gate biased to properly handle (i.e., remain in an off-state) higher voltage signals induced/received on an associated I/O. A core circuit operating at a lower operating voltage may be coupled to an ESD device configured with a control gate biased to properly handle (i.e., shunt current in an on-state) signals exceeding the expected lower voltages induce/received on an associated I/O. As such, a given voltage level permitted on one I/O of a chip may be shunted on another I/O as an ESD event.

Referring still to the illustrative embodiment in FIG. 2B, where the HVCMOS circuit 211 has a higher nominal operating voltage than does the CMOS circuit 210A, the control gate voltage $V_{cg,n}$ may be different than $V_{cg,1}$ to increase the extended drain resistance $R_{d,n}$ in the ESD protection device 102N relative to $R_{d,1}$ associated with the ESD protection device 102A. In certain such embodiments where the low voltage CMOS circuit 210A is operable at voltages no greater than 1.5V while the high voltage HVMOS circuit 211 is operable at voltages between 1.5 and 3.3V and the control gate voltages $V_{cg,1}$ and $V_{cg,n}$ are both between 0V and 1.2V for one exemplary non-planar ggNMOS implementation. A similar modulation may further be practiced between the two CMOS circuits 210A and 210B where the two have different operating voltages (e.g., CMOS circuit 210B being an ultralow power circuit having a nominal operating point below 1.0V).

In further embodiments, performance of an associated ESD protection device is modulated dynamically as a function of a core circuit state characteristic over time (e.g., at operation 297A changes in FIG. 2C) by varying the control gate bias (e.g., at operation 298 in FIG. 2C). For example, where one or more of the core circuits 210A, 210B, or 211 may on occasion enter a power save state (mode), or be placed into a temporarily disabled state, etc., one or more of the gate control voltages $V_{cg,1}$, $V_{cg,2}$, $V_{cg,n}$ may bias the control gate of an ESD protection device to modulate ESD protection device power consumption and/or robustness of ESD protection over time. Additionally, the presence of control gates and their further coupling to individual control gate voltage potentials may be modulated post-fabrication to separately account for variation in the IC fabrication processes (e.g., input 297B) or variation in the application environment in which the IC chip 202 is subjected. With the control gate voltages set, the method 295 continues with operation of the IC chip at operation 299.

While the exemplary embodiments described in the context of FIGS. 2B and 2C illustrate advantages of the independent control gate biasing of ESD protection device and, more particularly advantages of core circuit-based ESD protection device control gate biasing, within a single IC chip (such as for a mixed signal or SoC embodiments), the advantages of such ESD protection device performance modulation are also applicable in the context of a foundry process where a tunable ESD protection device may enable standardization of ESD protection across ASICs.

Figure 3:
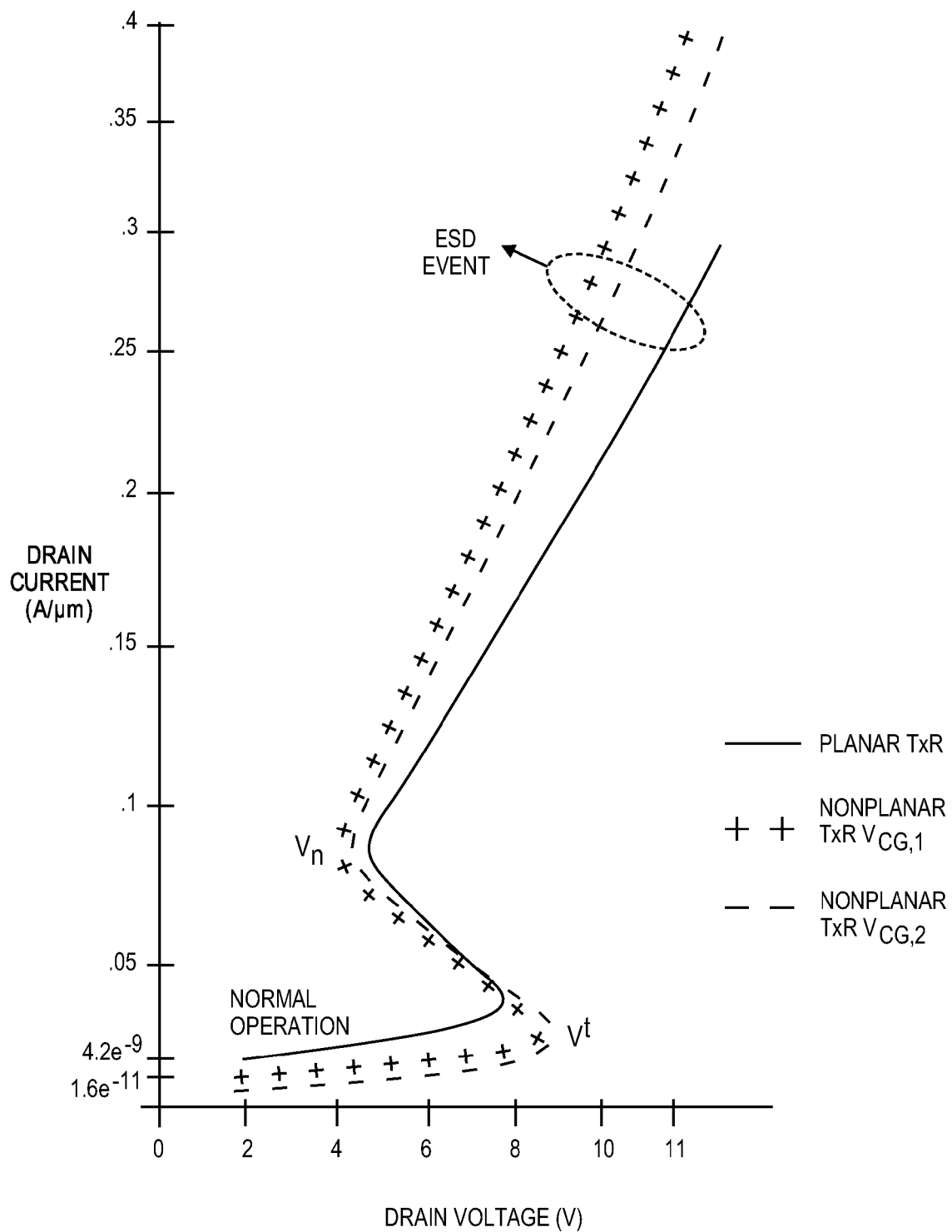
FIG. 3 is an I-V plot illustrating snap back characteristics for planar and non-planar MOSFET-based ESD protection devices during ESD events and normal operation, in accordance with embodiments.

FIG. 3 is an I-V plot illustrating snap back characteristics for planar and non-planar MOSFET-based ESD protection devices of comparable current capacity during ESD events and normal operation, in accordance with embodiments. In FIG. 3, voltage of the device under test (DUT), and more specifically drain voltage in the ggNMOS configuration, is on the x-axis, while the device current, and more specifically drain current, is on the y-axis. Notably, leakage levels of the planar ESD protection device are significantly higher than the two exemplary non-planar protection devices. In specific embodiments, where off-state leakage (during normal core circuit operation) for a planar ESD protection device is approximately 1.5e-11 A/μm of channel width, off-state leakage for the non-planar ESD protection devices describe herein are approximately 4.2e-9 A/μm, or lower. Variation in current conduction is further illustrated in FIG. 3 for a non-planar MOSFET-based ESD protection device having different control gate bias potentials, $V_{cg,1}$ and $V_{cg,2}$. Also shown in a comparison of on-state current between planar, non-planar devices and further for non-planar devices as a function of the different control gate bias potentials. Notably, the on-state current of the non-planar ESD protection devices is higher, more specifically for the embodiments having the leakage levels described above, the on-state current at 11V of drain voltage for the planar ESD protection device is approximately 0.28 A/μm while the on-state current at 11V for the non-planar ESD protection devices described for embodiments herein is 0.4 A/μm, or greater.

Figure 4:
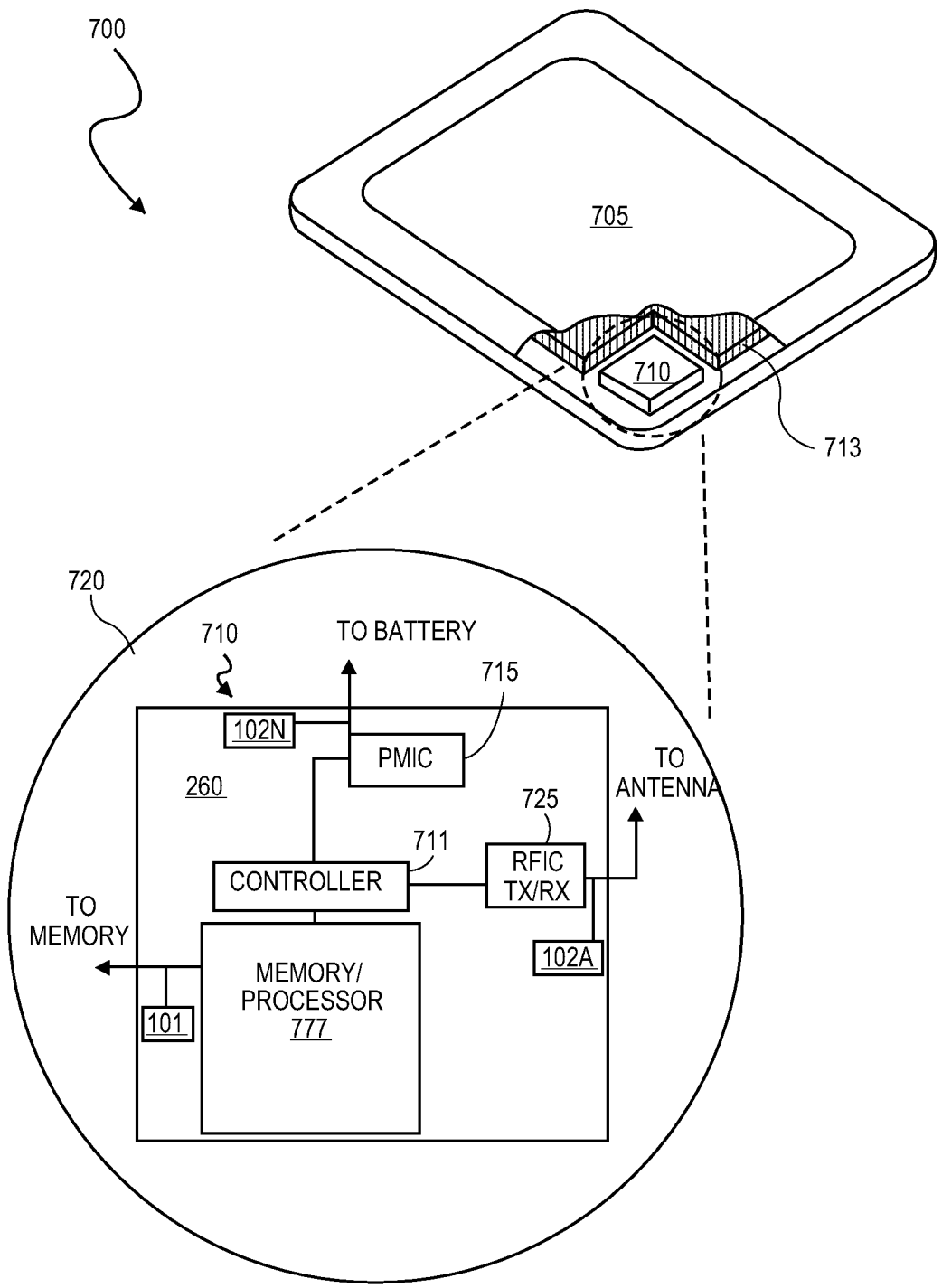
FIG. 4 is an isometric view of a mobile computing platform employing an IC with extended drain non-planar MOSFET ESD protection, in accordance with an embodiment of the present invention.

FIG. 4 is an isometric view and schematic of a mobile computing platform 700 which employs an IC including extended drain non-planar MOSFET ESD circuitry, in accordance with embodiments of the present invention. The mobile computing platform 700 may be any portable device configured for each of electronic data display, electronic data processing, and wireless electronic data transmission. For example, mobile computing platform 700 may be any of a tablet, a smart phone, laptop computer, etc. and includes a display screen 405 which in the exemplary embodiment is a touchscreen (capacitive, inductive, resistive, etc.), a chip-level (SoC) or package-level integrated system 710, and a battery 713.

The integrated system 710 is further illustrated in the expanded view 720. In the exemplary embodiment, packaged device 777 includes at least one memory chip (e.g., RAM), and/or at least one processor chip (e.g., a multi-core microprocessor and/or graphics processor) with core circuitry coupled to an I/O and a non-planar ggNMOS ESD protection device disposed there between. In embodiments, as described in more detail elsewhere herein, the ggNMOS ESD protection device includes a plurality of semiconductor fins having a lightly doped extended drain region disposed on a first side of a gate electrode, and spacing the gate electrode farther from a heavily doped drain region of the semiconductor fin than a spacing between the gate electrode and a source region of the semiconductor fin. The packaged device 777 is further coupled to the board, substrate, or interposer 260 along with, one or more of a power management integrated circuit (PMIC) 715, RF (wireless) integrated circuit (RFIC) 725 including a wideband RF (wireless) transmitter and/or receiver (e.g., including a digital baseband and an analog front end module further comprises a power amplifier on a transmit path and a low noise amplifier on a receive path), and a controller thereof 711. As illustrated, interfaces of each of these ICs includes an extended drain MOSFET-based ESD protection device 101, 102A, or 102N, where these reference numbers represent the same devices described in the context of FIGS. 1A, 1B, and 2B. In further embodiments, one, some or all of the extended drain MOSFET-based ESD protection devices employing within the packaged device 777 include a control gate. In further embodiments, for example in the ESD protection devices 102A and 102N illustrated in FIG. 4, ESD protection device control gates are associated with different control gate bias voltages.

Functionally, the PMIC 715 performs battery power regulation, DC-to-DC conversion, etc., and so has an input coupled to the battery 713 and with an output providing a current supply to all the other functional modules. As further illustrated, in the exemplary embodiment the RFIC 725 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 777 or within a single IC (SoC) coupled to the package substrate of the packaged device 777.

Figure 5:
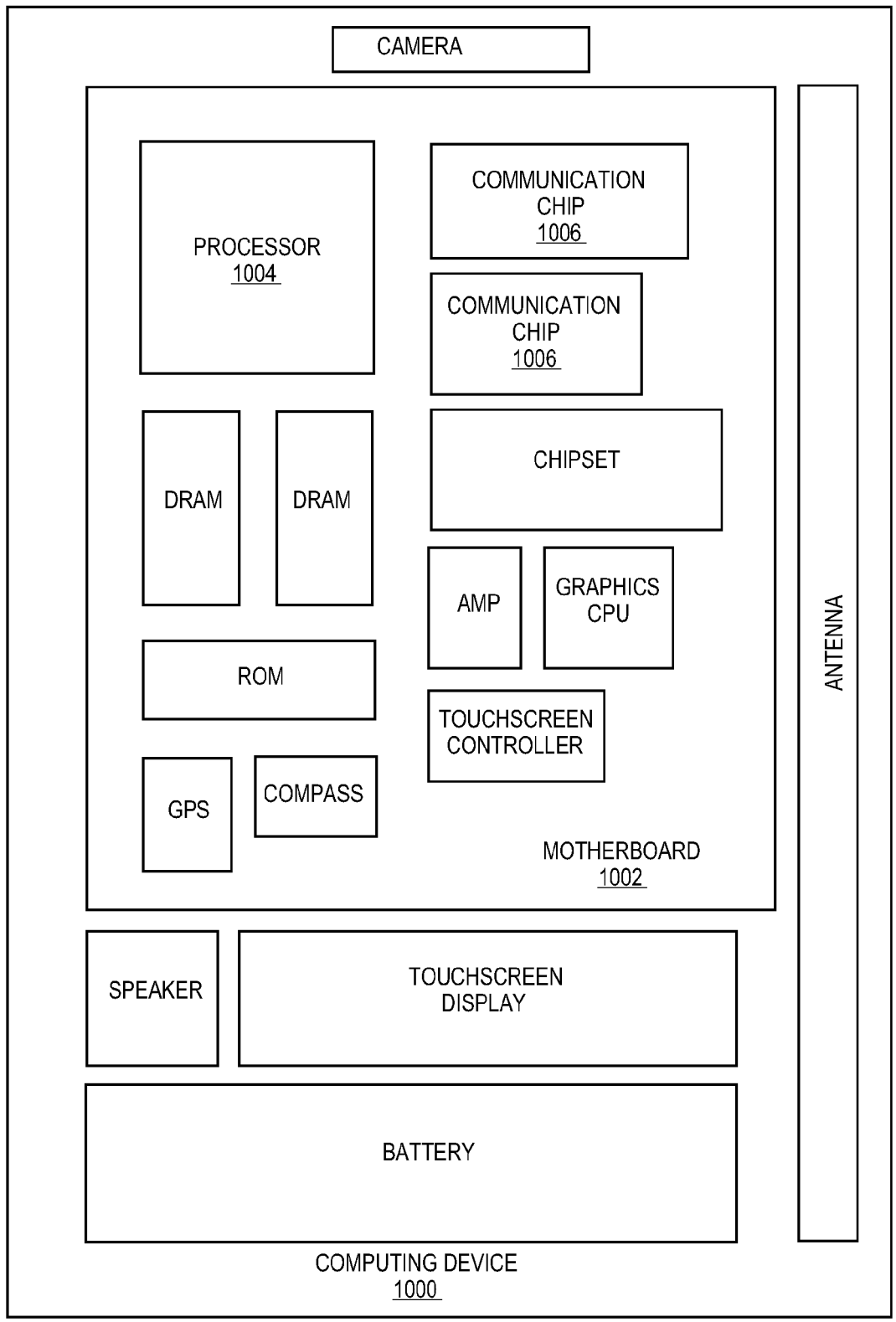
FIG. 5 is a functional block diagram of the mobile device illustrated in FIG. 4, in accordance with an embodiment of the present invention.

FIG. 5 is a functional block diagram of a computing device 1000 in accordance with one embodiment of the invention. The computing device 1000 may be found inside the platform 700, for example, and further includes a board 1002 hosting a number of components, such as but not limited to a processor 1004 (e.g., an applications processor) and at least one communication chip 1006. In embodiments, at least one of the processor 1004 and communication chip 1006 incorporate extended drain non-planar MOSFET-based ESD protection devices. The processor 1004 is physically and electrically coupled to the board 1002. The processor 1004 includes an integrated circuit die packaged within the processor 1004. The term "processor" may refer to any device or portion of a device that processes electronic data from registers and/or memory to transform that electronic data into other electronic data that may be stored in registers and/or memory.

In some implementations the at least one communication chip 1006 is also physically and electrically coupled to the board 1002. In further implementations, the communication chip 1006 is part of the processor 1004. Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth).

At least one of the communication chips 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to those described elsewhere herein. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The preceding paragraphs describe many exemplary embodiments. In one embodiment, for example, an electrostatic discharge (ESD) protection device includes a plurality of semiconductor fins extending from a substrate with a gate electrode disposed over the plurality of semiconductor fins; a source region and a drain region disposed in each of the semiconductor fins on opposite sides of the gate electrode, wherein the source region and the gate electrode are electrically coupled to one or more integrated circuit (IC) nodes having a same ground reference potential, wherein and the drain region is electrically coupled to a circuit node disposed between an I/O of the IC and core circuitry of the IC coupled to the I/O; and a lightly doped extended drain region disposed in the semiconductor fins and spacing apart the gate electrode from the drain regions by an amount greater than a spacing between the gate electrode and the source regions. In further embodiments, a control gate is disposed over the semiconductor fins between the gate electrode and the drain regions, wherein the control gate is capacitively coupled to at least a portion of the extended drain region and electrically insulated from the gate electrode. In further embodiments, the control gate is to control charge carrier depletion or accumulation within the extended drain region to adjust a snapback holding voltage of the device. In further embodiments, a control gate voltage source is coupled to the control gate, wherein the control gate voltage source is to set the control gate to a predetermined control gate voltage potential other than the gate electrode reference potential. In further embodiments, the control gate and the gate electrode are of a same material and are capacitively coupled to the semiconductor fins through a same gate dielectric, wherein the control gate is spaced apart from the drain region by an amount less than a spacing between the gate electrode and the control gate. In embodiments, the semiconductor comprises silicon doped p-type below the gate electrode, wherein the source and drain regions are heavily doped n-type, wherein the extended drain region is doped n-type to $10^{16}$ cm$^{-3}$-$10^{20}$ cm$^{-3}$, and wherein on-state current of the device is at least 0.4 A/μm of channel width or a drain voltage of 11V.

In embodiments, an integrated circuit device, includes: a plurality of core circuits disposed over a substrate; a plurality of I/Os disposed over the substrate, wherein each of the core circuits is coupled to at least one of the I/Os to interface the core circuits with one or more external devices; a plurality of electrostatic discharge (ESD) protection devices, each ESD protection device coupled to a node disposed between at least one of the core circuits and at least one of the I/O pins or pads, wherein each of the ESD protection devices comprise an extended drain non-planar metal-oxide-semiconductor field effect transistor (MOSFET) including: a plurality of semiconductor fins, each having a source region and drain region disposed on opposite sides of a gate electrode disposed over the semiconductor fins; and a control gate disposed over the semiconductor fins capacitively coupled to a lightly doped extended drain region disposed in the semiconductor fins between the drain region and the gate electrode; and a plurality of control gate voltage sources coupled to the ESD protection devices, wherein ones of the control gate voltage sources are coupled to separate control gates. In further embodiments of the integrated circuit device, the control gate voltage sources are independently controllable to predetermined voltage potentials other than the ground potential. In further embodiments, the predetermined voltage potentials are between 0.5V and 1.2V.

In further embodiments, the predetermined voltage potentials adjust a snapback voltage of the ESD protection device based on a characteristic of the core circuit to which the ESD protection device is coupled. In further embodiments, the source, drain and extend drain regions are n-type, the gate electrode and the source region are coupled to circuit nodes at ground potential of the core circuits, and the first and second control gate potentials are between 0V and 1.2V. In further embodiments, the plurality of circuits further comprises: a low voltage circuit coupled to a first of the I/Os and to a first of the ESD protection devices; and a high voltage circuit coupled to a second of the I/Os and to a second of the ESD protection devices, wherein the first ESD protection device has a first control gate coupled to a first control gate voltage source and the second ESD protection device has a second control gate coupled to a second control gate voltage source that is at a different control gate potential than the first control gate voltage source. In further embodiments, the second control gate voltage source is at a control gate voltage potential that increases the resistance of extended drain region of second ESD protection device relative to that of the first ESD protection device. In further embodiments, the low voltage circuit and high voltage circuit both further comprise one or more non-planar MOSFET, and wherein at least one of the non-planar MOSFETs in the high voltage circuit includes an extended drain region having a higher source-drain resistance that of any of the non-planar MOSFETs in the low voltage circuit. In further embodiments, the low voltage circuit is operable at voltages no greater than 1.5V and wherein the high voltage circuit is operable at voltages between 1.5 and 3.3V.

In embodiments, a method of operating non-planar ggNMOS ESD protection devices coupled to an integrated circuit (IC), the method includes coupling a gate electrode of a first of the non-planar ggNMOS ESD protection devices to ground potential, wherein the gate electrode is capacitively coupled to a non-planar semiconductor body and spaced apart, by a lightly-doped extended drain, from a heavily doped drain coupled to an I/O of the integrated circuit by a spacing greater than that between the gate electrode and a heavily doped source region of the semiconductor fin; and setting a control gate electrically insulated from the gate electrode, and capacitively coupled to the extended drain, to a different voltage potential than the gate electrode. In further embodiments, the method includes coupling a gate electrode of a second of the non-planar ggNMOS ESD protection devices to a ground potential; and setting a control gate of the second of the non-planar ggNMOS ESD protection devices to a different voltage potential than that of the first of the non-planar ggNMOS ESD protection devices.

In embodiments, a mobile computing device includes a processor with core circuitry coupled to an I/O and a non-planar ggNMOS ESD protection device disposed there between, wherein the ESD protection device includes a plurality of semiconductor fins having a lightly doped extended drain region disposed on a first side of a gate electrode, and spacing the gate electrode farther from a heavily doped drain region of the semiconductor fin than a spacing between the gate electrode and a source region of the semiconductor fin; a display screen; an RF transmitter or receiver; and an antenna. In further embodiments, the non-planar ggNMOS ESD protection device further comprises a control gate capacitively coupled to the lightly doped extended drain region, wherein the control gate is electrically insulated from the gate electrode and at a different potential than the gate electrode. In further embodiments, the processor and RF transmitter or receiver are on a single integrated circuit (IC) as components of a system on a chip (SoC) and wherein the RF transmitter or receiver further comprise second core circuitry coupled to a second I/O and a second non-planar ggNMOS ESD protection device disposed there between, wherein the second ESD protection device has a control gate coupled to a second control gate voltage source.

It will be recognized that the invention is not limited to these embodiments so described, but can be practiced with modification and alteration without departing from the scope of the appended claims. The scope of the invention should, therefore, be determined with reference to the appended claims, along with the full scope of equivalents to which such claims are entitled.

What is claimed is:

1. An electrostatic discharge (ESD) protection device, comprising:
 a plurality of semiconductor fins extending from a substrate with a gate electrode disposed over the plurality of semiconductor fins;
 a heavily doped source region and a heavily doped drain region disposed in each of the semiconductor fins on opposite sides of the gate electrode, wherein the source region and the gate electrode are electrically coupled to one or more integrated circuit (IC) nodes having a same ground reference potential, wherein and the drain region is electrically coupled to a circuit node disposed between an I/O of the IC and core circuitry of the IC coupled to the I/O; and a lightly doped extended drain region disposed in the semiconductor fins and spacing apart the gate electrode from the heavily doped drain regions by an amount greater than a spacing between the gate electrode and the source regions.

2. The device of claim 1, further comprising:
a control gate disposed over the semiconductor fins between the gate electrode and the drain regions, wherein the control gate is capacitively coupled to at least a portion of the heavily doped extended drain region and electrically insulated from the gate electrode.

3. The microelectronic device of claim 2, wherein the control gate is to control charge carrier depletion or accumulation within the extended drain region to adjust a snapback holding voltage of the device.

4. The device of claim 2, further comprising a control gate voltage source coupled to the control gate, wherein the control gate voltage source is to set the control gate to a predetermined control gate voltage potential other than the gate electrode reference potential.

5. The device of claim 4, wherein the control gate and the gate electrode are of a same material and are capacitively coupled to the semiconductor fins through a same gate dielectric, wherein the control gate is spaced apart from the drain region by an amount less than a spacing between the gate electrode and the control gate.

6. The device of claim 1, wherein the semiconductor comprises silicon doped p-type below the gate electrode, wherein the source and drain regions are heavily doped n-type, wherein the extended drain region is doped n-type to $10^{16}$ cm$^{-3}$-$10^{20}$ cm$^{-3}$, and wherein on-state current of the device is at least 0.4 A/μm of channel width or a drain voltage of 11V.

7. An integrated circuit device, comprising:
a plurality of core circuits disposed over a substrate;
a plurality of I/Os disposed over the substrate, wherein each of the core circuits is coupled to at least one of the I/Os to interface the core circuits with one or more external devices;
a plurality of electrostatic discharge (ESD) protection devices, each ESD protection device coupled to a node disposed between at least one of the core circuits and at least one of the I/O pins or pads, wherein each of the ESD protection devices comprise an extended drain non-planar metal-oxide-semiconductor field effect transistor (MOSFET) including:
a plurality of semiconductor fins, each having a source region and drain region disposed on opposite sides of a gate electrode disposed over the semiconductor fins; and
a control gate disposed over the semiconductor fins capacitively coupled to a lightly doped extended drain region disposed in the semiconductor fins between the drain region and the gate electrode; and
a plurality of control gate voltage sources coupled to the ESD protection devices, wherein ones of the control gate voltage sources are coupled to separate control gates.

8. The integrated circuit device of claim 7, wherein the control gate voltage sources are independently controllable to predetermined voltage potentials other than the ground potential.

9. The integrated circuit device of claim 8, wherein the predetermined voltage potentials are between 0.5V and 1.2V.

10. The integrated circuit device of claim 8, wherein the predetermined voltage potentials adjust a snapback voltage of the ESD protection device based on a characteristic of the core circuit to which the ESD protection device is coupled.

11. The integrated circuit device of claim 10, wherein the source, drain and extend drain regions are n-type, the gate electrode and the source region are coupled to circuit nodes at ground potential of the core circuits, and the first and second control gate potentials are between 0V and 1.2V.

12. The integrated circuit device of claim 10, wherein the plurality of circuits further comprises:
a low voltage circuit coupled to a first of the I/Os and to a first of the ESD protection devices; and
a high voltage circuit coupled to a second of the I/Os and to a second of the ESD protection devices, wherein the first ESD protection device has a first control gate coupled to a first control gate voltage source and the second ESD protection device has a second control gate coupled to a second control gate voltage source that is at a different control gate potential than the first control gate voltage source.

13. The integrated circuit device of claim 11, wherein the second control gate voltage source is at a control gate voltage potential that increases the resistance of extended drain region of second ESD protection device relative to that of the first ESD protection device.

14. The integrated circuit device of claim 12, wherein the low voltage circuit and high voltage circuit both further comprise one or more non-planar MOSFET, and wherein at least one of the non-planar MOSFETs in the high voltage circuit includes an extended drain region having a higher source-drain resistance that of any of the non-planar MOSFETs in the low voltage circuit.

15. The integrated circuit device of claim 12, wherein the low voltage circuit is operable at voltages no greater than 1.5V and wherein the high voltage circuit is operable at voltages between 1.5 and 3.3V.

16. A method of operating non-planar ggNMOS ESD protection devices coupled to an integrated circuit (IC), the method comprising:
coupling a gate electrode of a first of the non-planar ggNMOS ESD protection devices to ground potential, wherein the gate electrode is capacitively coupled to a non-planar semiconductor body and spaced apart, by a lightly-doped extended drain, from a heavily doped drain coupled to an I/O of the integrated circuit by a spacing greater than that between the gate electrode and a heavily doped source region of the semiconductor fin; and
setting a control gate electrically insulated from the gate electrode, and capacitively coupled to the extended drain, to a different voltage potential than the gate electrode.

17. The method of claim 16, further comprising:
coupling a gate electrode of a second of the non-planar ggNMOS ESD protection devices to a ground potential; and
setting a control gate of the second of the non-planar ggNMOS ESD protection devices to a different voltage potential than that of the first of the non-planar ggNMOS ESD protection devices.

18. A mobile computing device, comprising:
a processor with core circuitry coupled to an I/O and a non-planar ggNMOS ESD protection device disposed there between, wherein the ESD protection device includes a plurality of semiconductor fins having a lightly doped extended drain region disposed on a first side of a gate electrode, and spacing the gate electrode farther from a heavily doped drain region of the semiconductor fin than a spacing between the gate electrode and a source region of the semiconductor fin;

a display screen;
an RF transmitter or receiver; and
an antenna.

19. The mobile computing device of claim 18, wherein the non-planar ggNMOS ESD protection device further comprises a control gate capacitively coupled to the lightly doped extended drain region, wherein the control gate is electrically insulated from the gate electrode and at a different potential than the gate electrode.

20. The mobile computing device of claim 19, wherein the processor and RF transmitter or receiver are on a single integrated circuit (IC) as components of a system on a chip (SoC) and wherein the RF transmitter or receiver further comprise second core circuitry coupled to a second I/O and a second non-planar ggNMOS ESD protection device disposed there between, wherein the second ESD protection device has a control gate coupled to a second control gate voltage source.

21. An electrostatic discharge (ESD) protection device, comprising:
 a plurality of semiconductor fins extending from a substrate with a gate electrode disposed over the plurality of semiconductor fins;
 a source region and a drain region disposed in each of the semiconductor fins on opposite sides of the gate electrode, wherein the source region and the gate electrode are electrically coupled to one or more integrated circuit (IC) nodes having a same ground reference potential, wherein and the drain region is electrically coupled to a circuit node disposed between an I/O of the IC and core circuitry of the IC coupled to the I/O;
 a lightly doped extended drain region disposed in the semiconductor fins and spacing apart the gate electrode from the heavily doped drain regions by an amount greater than a spacing between the gate electrode and the source regions; and
 a control gate disposed over the semiconductor fins between the gate electrode and the drain regions, wherein the control gate is capacitively coupled to at least a portion of the lightly doped extended drain region and electrically insulated from the gate electrode.

22. The microelectronic device of claim 21, wherein the control gate is to control charge carrier depletion or accumulation within the extended drain region to adjust a snapback holding voltage of the device.

23. The device of claim 21, further comprising a control gate voltage source coupled to the control gate, wherein the control gate voltage source is to set the control gate to a predetermined control gate voltage potential other than the gate electrode reference potential.

24. The device of claim 23, wherein the control gate and the gate electrode are of a same material and are capacitively coupled to the semiconductor fins through a same gate dielectric, wherein the control gate is spaced apart from the drain region by an amount less than a spacing between the gate electrode and the control gate.

25. The device of claim 21, wherein the semiconductor comprises silicon doped p-type below the gate electrode, wherein the source and drain regions are heavily doped n-type, wherein the extended drain region is doped n-type to $10^{16}$ cm$^{-3}$-$10^{20}$ cm$^{-3}$, and wherein on-state current of the device is at least 0.4 A/μm of channel width or a drain voltage of 11V.

* * * * *

UNITED STATES PATENT AND TRADEMARK OFFICE
CERTIFICATE OF CORRECTION

PATENT NO. : 9,087,719 B2  
APPLICATION NO. : 13/631586  
DATED : July 21, 2015  
INVENTOR(S) : Akm Ahsan et al.

Page 1 of 1

It is certified that error appears in the above-identified patent and that said Letters Patent is hereby corrected as shown below:

In the Claims

Col. 13, Line 8 before "drain" insert --heavily doped-- therein.

Col. 13, Line 10 delete "heavily" and insert --lightly-- therein.

Col. 16, Line 1 delete "heavily doped".

Signed and Sealed this  
Sixteenth Day of February, 2016

Michelle K. Lee  
*Director of the United States Patent and Trademark Office*